United States Patent
Sekiya

(10) Patent No.: US 11,148,243 B2
(45) Date of Patent: Oct. 19, 2021

(54) CUTTING BLADE SUPPLYING APPARATUS AND CUTTING BLADE CASE

(71) Applicant: DISCO CORPORATION, Tokyo (JP)

(72) Inventor: Kazuma Sekiya, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 217 days.

(21) Appl. No.: 16/121,897

(22) Filed: Sep. 5, 2018

(65) Prior Publication Data

US 2019/0070701 A1  Mar. 7, 2019

(30) Foreign Application Priority Data

Sep. 7, 2017 (JP) .............................. JP2017-171942

(51) Int. Cl.
  *B23Q 3/155*  (2006.01)
  *H05K 3/00*  (2006.01)
  *H01L 21/67*  (2006.01)

(52) U.S. Cl.
  CPC ........ *B23Q 3/15539* (2016.11); *B23Q 3/1554* (2013.01); *B23Q 3/15513* (2013.01); *H05K 3/0097* (2013.01); *B23Q 2003/1553* (2016.11); *B23Q 2003/15537* (2016.11); *B23Q 2003/155411* (2016.11); *H01L 21/67092* (2013.01)

(58) Field of Classification Search
  CPC .............. Y10T 483/18; Y10T 483/115; Y10T 483/174; Y10T 483/1776; Y10T 483/1779; Y10T 483/1783; B23Q 13/00; B23Q 3/15773; B23Q 3/15526; B23Q 3/15536; B23Q 2003/155407; B23Q 2003/155411; B23Q 2003/15528; B23Q 2003/1553; B23Q 2003/15537; B23Q 3/15539; B23Q 3/15513; B23Q 3/1554; H05K 3/0097; H01L 21/67092

USPC ......................... 206/349, 354, 355, 372, 373
See application file for complete search history.

(56) References Cited

U.S. PATENT DOCUMENTS

| | | | | | |
|---|---|---|---|---|---|
| 4,344,221 | A | * | 8/1982 | Pagani | B23Q 3/15539 483/8 |
| 4,631,465 | A | * | 12/1986 | Fukuyama | G05B 19/4069 318/565 |
| 4,875,288 | A | * | 10/1989 | Trotta | B26B 21/56 30/49 |

(Continued)

FOREIGN PATENT DOCUMENTS

JP  2007105829 A  4/2007

OTHER PUBLICATIONS

Sekiya, Kazuma, U.S. Appl. No. 16/122,232, filed Sep. 5, 2018.

*Primary Examiner* — Boyer D Ashley
*Assistant Examiner* — Yasir A Diab
(74) *Attorney, Agent, or Firm* — Greer Burns & Crain, Ltd.

(57) ABSTRACT

A cutting blade supplying apparatus includes a cutting blade stocker that stocks a plurality of cutting blades; a carrying unit that carries out the cutting blade from the cutting blade stocker and carries the cutting blade to a cutting apparatus, a transferring unit that transfers the cutting blade carried by the carrying unit to a cutting blade replacing unit of the cutting apparatus, and a control unit. The cutting blade stocker includes a cutting blade case that accommodates the cutting blades each of which includes a mounting port formed in a center thereof to be mounted to a spindle and a cutting edge formed at an outer periphery of the mounting port, and a cutting blade case mounting unit on which to mount the cutting blade case.

5 Claims, 7 Drawing Sheets

(56) References Cited

U.S. PATENT DOCUMENTS

| | | | | |
|---|---|---|---|---|
| 4,987,703 | A * | 1/1991 | Brill | B23Q 3/15553 |
| | | | | 451/28 |
| 5,139,167 | A * | 8/1992 | McCarthy | B65D 83/10 |
| | | | | 206/354 |
| 5,220,749 | A * | 6/1993 | Youden | B23B 31/261 |
| | | | | 451/342 |
| 5,775,973 | A * | 7/1998 | Watanabe | B24B 47/225 |
| | | | | 451/10 |
| 6,220,929 | B1 * | 4/2001 | Mizuno | B24B 9/148 |
| | | | | 451/10 |
| 6,832,946 | B2 * | 12/2004 | Hatano | B24B 9/144 |
| | | | | 451/43 |
| 2004/0014408 | A1 * | 1/2004 | Sekiya | B23P 11/027 |
| | | | | 451/342 |
| 2006/0079384 | A1 * | 4/2006 | Yoshida | B23Q 3/15713 |
| | | | | 483/7 |
| 2006/0186004 | A1 * | 8/2006 | Smith | B65D 85/02 |
| | | | | 206/349 |
| 2006/0217036 | A1 * | 9/2006 | Meunier | B24B 9/14 |
| | | | | 451/5 |
| 2007/0184954 | A1 * | 8/2007 | Muser | B23Q 3/15539 |
| | | | | 483/1 |
| 2008/0051013 | A1 * | 2/2008 | Burgess | B24B 53/062 |
| | | | | 451/51 |
| 2010/0058596 | A1 * | 3/2010 | Shim | B26B 19/06 |
| | | | | 30/216 |
| 2012/0231706 | A1 * | 9/2012 | Videcoq | B24B 13/00 |
| | | | | 451/41 |
| 2015/0020666 | A1 * | 1/2015 | Wakita | B27B 5/32 |
| | | | | 83/401 |
| 2016/0207216 | A1 * | 7/2016 | Nitta | B23B 31/307 |

\* cited by examiner

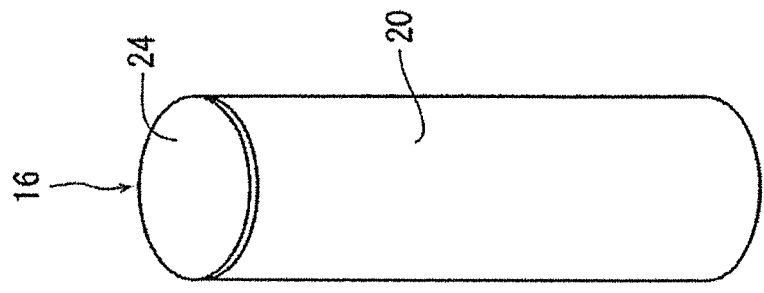
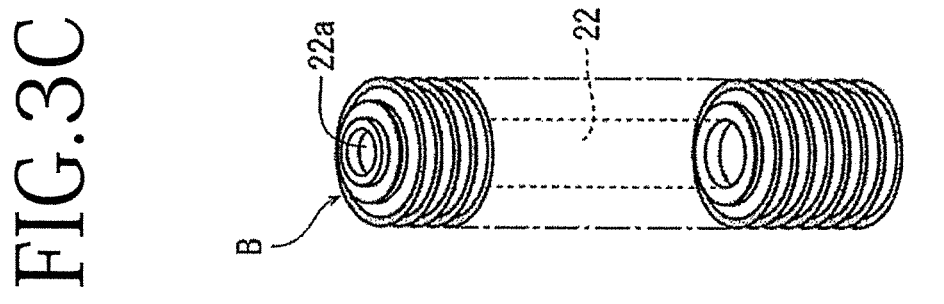
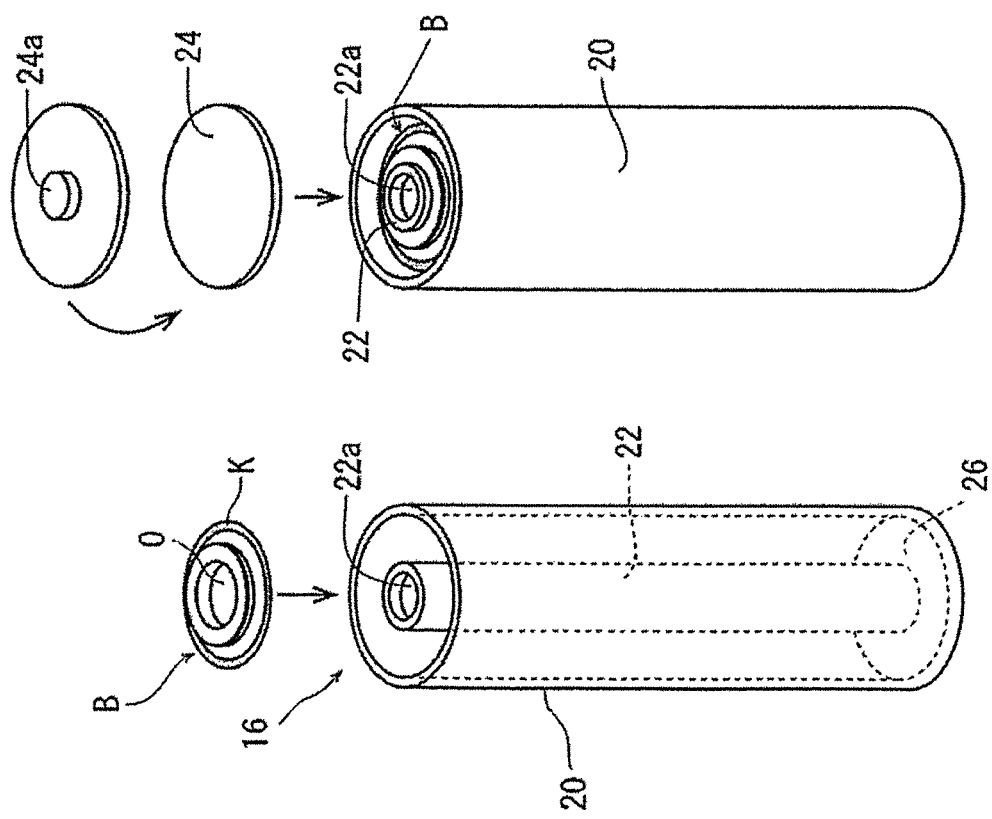

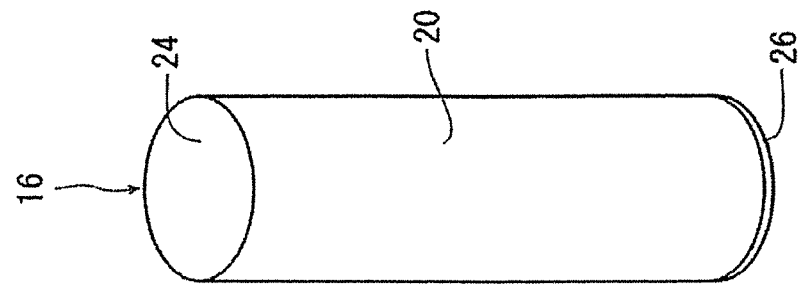
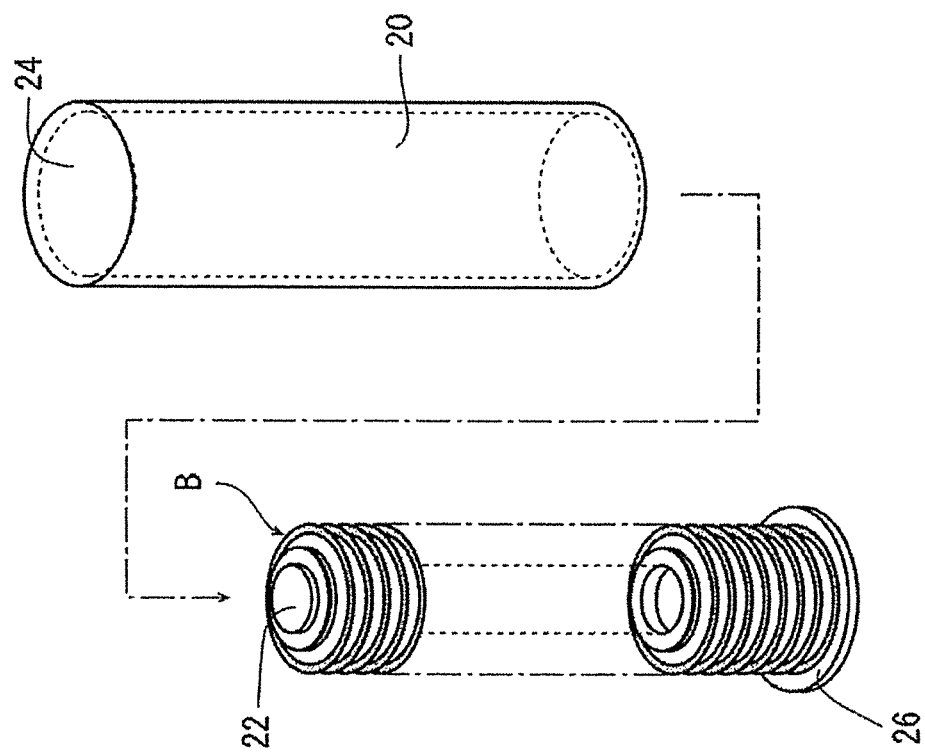
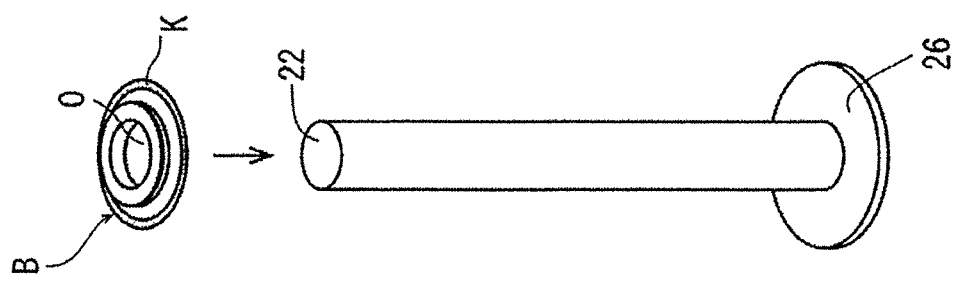

CUTTING BLADE SUPPLYING APPARATUS AND CUTTING BLADE CASE

BACKGROUND OF THE INVENTION

Field of the Invention

The present invention relates to a cutting blade supplying apparatus for supplying a cutting blade to a cutting apparatus, and a cutting blade case for accommodating the cutting blade.

Description of the Related Art

A wafer with a plurality of devices such as integrated circuits (ICs) and large scale integrations (LSIs) formed on its front surface partitioned by division lines (streets) is divided by a cutting apparatus into individual devices, and the thus divided devices are used for electric apparatuses such as mobile phones and personal computers.

In addition, for enabling an unmanned operation of the cutting apparatus, a cutting apparatus in which a cutting blade can be automatically replaced has been developed by the present applicant (see, for example, Japanese Patent No. 4837973).

SUMMARY OF THE INVENTION

However, the cutting apparatus disclosed in Japanese Patent No. 4837973 has a problem that the stock of cutting blades for replacement is insufficient, and an unmanned operation for a long time is difficult to achieve.

Accordingly, it is an object of the present invention to provide a cutting blade supplying apparatus by which a sufficient number of cutting blades for replacement can be stocked and a cutting apparatus provided with a blade replacing unit can be appropriately supplied with a cutting blade, and a cutting blade case by which the cutting blade supplying apparatus can be easily supplied with cutting blades.

In accordance with an aspect of the present invention, there is provided a cutting blade supplying apparatus for supplying a cutting blade to a cutting apparatus, the cutting apparatus including a holding unit configured to hold a workpiece, a cutting unit to which a cutting blade for cutting the workpiece held by the holding unit is rotatably mounted, a feeding unit configured to put the holding unit and the cutting unit into relative processing feeding, and a blade replacing unit configured to automatically mount and detach the cutting blade mounted to the cutting unit, the cutting blade supplying apparatus including: a cutting blade stocker that stocks a plurality of cutting blades; a carrying unit that carries out the cutting blade from the cutting blade stocker and carries the cutting blade to the cutting apparatus; a transferring unit that transfers the cutting blade carried by the carrying unit to the blade replacing unit; and a control unit, in which the cutting blade stocker includes: a cutting blade case that accommodates the cutting blade including a mounting port formed in a center thereof to be mounted to a spindle and a cutting edge formed at an outer periphery of the mounting port; and a cutting blade case mounting unit on which to mount the cutting blade case, the cutting blade case includes: a tubular body that accommodates two or more cutting blades in a stacked state; and a rod to be inserted in the mounting port to avoid contact between the cutting edge and an inner wall of the tubular body, and the control unit selects the cutting blade required by the cutting apparatus and causes the cutting blade to be carried by the carrying unit to the cutting apparatus.

Preferably, the carrying unit includes a carrying-out section that carries out the cutting blade from the cutting blade stocker, and a belt conveyor that carries the cutting blade carried out by the carrying-out section to the cutting apparatus. Preferably, the transferring unit includes a carrying-out machine that holds and carries out the cutting blade carried by the carrying unit, and a blade rack that receives the cutting blade carried out by the carrying-out machine and carries the cutting blade to the blade replacing unit. Preferably, the cutting blade supplying apparatus further includes a display unit, in which the control unit records the numbers of the cutting blades carried out from the cutting blade stocker on the basis of the kind of the cutting blade, and causes the numbers of the cutting blades capable of being further stocked in the cutting blade stocker to be displayed on the display unit on the basis of the kind of the cutting blade. Preferably, the cutting blade case includes a lid wall that detachably closes one end portion of the tubular body, and an end wall that closes the other end portion of the tubular body, and the rod is fixed to a central portion of the end wall.

In accordance with another aspect of the present invention, there is provided a cutting blade case for accommodating a cutting blade including a mounting port formed in a center thereof to be mounted to a spindle and a cutting edge formed at an outer periphery of the mounting port, the cutting blade case including: a tubular body that accommodates two or more cutting blades in a stacked state; and a rod to be inserted in the mounting port to avoid contact between the cutting edge and an inner wall of the tubular body.

Preferably, the cutting blade case includes a lid wall that detachably closes one end portion of the tubular body, and an end wall that closes the other end portion of the tubular body, in which the rod is fixed to a central portion of the end wall.

The cutting blade supplying apparatus according to the one aspect of the present invention is a cutting blade supplying apparatus for supplying a cutting blade to a cutting apparatus, the cutting apparatus including the holding unit for holding a workpiece, the cutting unit to which the cutting blade for cutting the workpiece held by the holding unit is rotatably mounted, the feeding unit for putting the holding unit and the cutting unit into relative processing feeding, and the blade replacing unit for automatically mounting and detaching the cutting blade mounted to the cutting unit. The cutting blade supplying apparatus includes: the cutting blade stocker that stocks a plurality of cutting blades; the carrying unit that carries out the cutting blade from the cutting blade stocker and carries the cutting blade to the cutting apparatus; the transferring unit that transfers the cutting blade carried by the carrying unit to the blade replacing unit; and the control unit. The cutting blade stocker includes: the cutting blade case that accommodates the cutting blade including the mounting port formed in the center thereof to be mounted to the spindle and the cutting edge formed at the outer periphery of the mounting port; and the cutting blade case mounting unit on which to mount the cutting blade case. The cutting blade case includes: the tubular body that accommodates two or more cutting blades in a stacked state; and the rod to be inserted in the mounting port to avoid contact between the cutting edge and the inner wall of the tubular body. The control unit selects the cutting blade required by the cutting apparatus and causes the cutting blade to be carried by the carrying unit to the cutting apparatus. Therefore, a sufficient number of cutting blades for replacement can be stocked, the cutting apparatus provided with the blade replacing unit can be appropriately supplied with the cutting blade, and, accordingly, an unmanned operation of the cutting apparatus for a long time can be achieved.

The cutting blade case according to the another aspect of the present invention is a cutting blade case for accommodating the cutting blade including the mounting port formed in the center thereof to be mounted to the spindle and the cutting edge formed at the outer periphery of the mounting port. The cutting blade case includes: the tubular body that accommodates two or more cutting blades in a stacked state; and the rod to be inserted in the mounting port to avoid contact between the cutting edge and the inner wall of the tubular body. Therefore, the cutting blade case in which a plurality of cutting blades are accommodated can be used as part of the cutting blade stocker, and, accordingly, supplement of the cutting blade supplying apparatus with the cutting blades is easy to perform.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 3A is a perspective view depicting a state in which the cutting blade is accommodated in a cutting blade case depicted in FIG. 2;

FIG. 3B is a perspective view depicting a state in which a plurality of cutting blades are accommodated in the cutting blade case;

FIG. 3C is a perspective view depicting the cutting blade case by omitting a tubular body and a lid wall from the state depicted in FIG. 3B;

FIG. 3D is a perspective view depicting a state in which one end portion of the tubular body is closed by the lid wall;

FIG. 4A is a perspective view depicting a state in which a cutting blade is accommodated on a rod of a cutting blade case according to a modification;

FIG. 4B is a perspective view depicting a state in which a tubular body is mounted after the cutting blades are accommodated on the rod of the cutting blade case according to the modification;

FIG. 4C is a perspective view depicting a state in which a tubular body and a lid wall are mounted to the rod, on which the cutting blades are accommodated, and an end wall from the state depicted in FIG. 4B;

DETAILED DESCRIPTION OF THE PREFERRED EMBODIMENT

Figure 1:
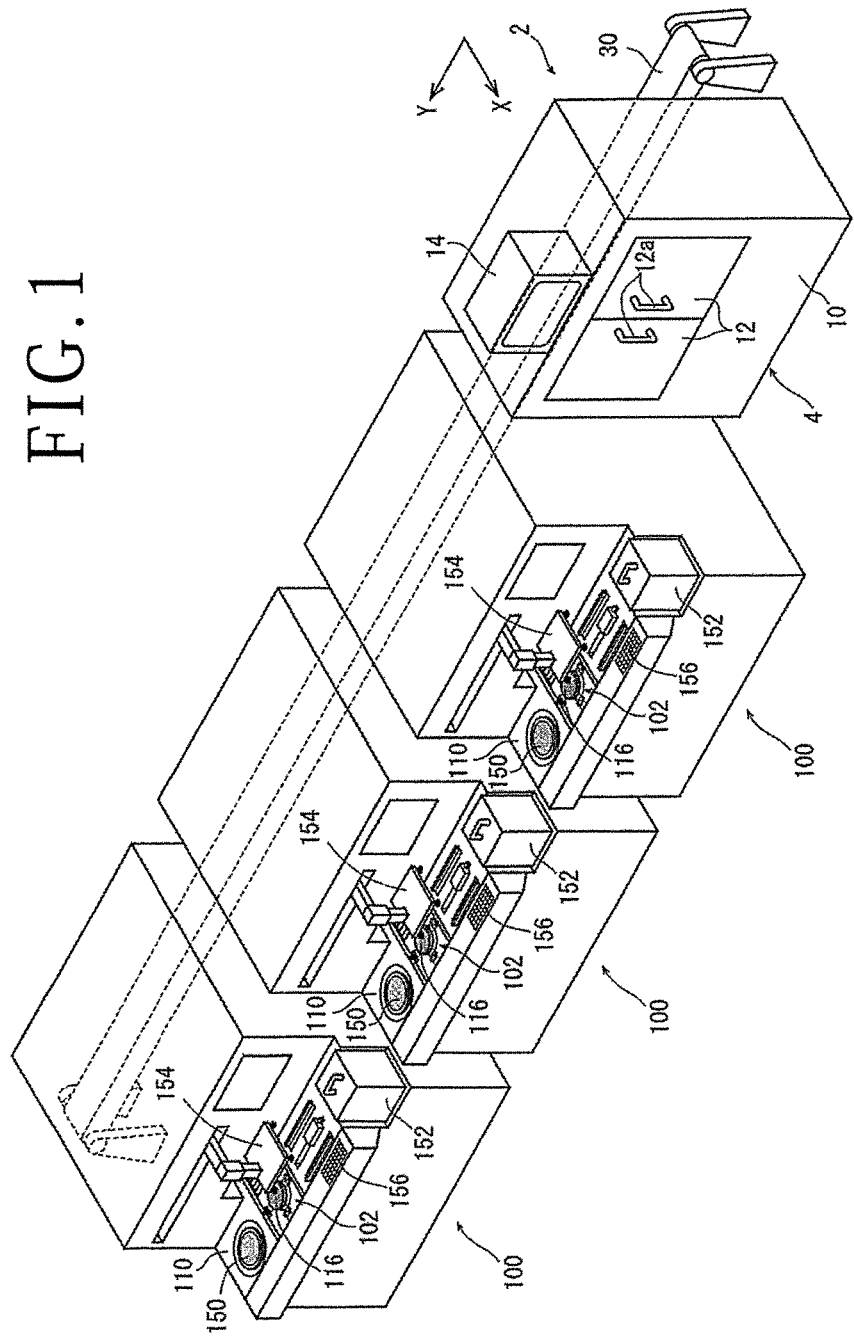
FIG. 1 is a perspective view of a cutting blade supplying apparatus and a plurality of cutting apparatuses.

An embodiment of a cutting blade supplying apparatus and a cutting blade case will be described below, referring to the drawings.

In the embodiment illustrated, as depicted in FIG. 1, a cutting blade supplying apparatus 2 and three cutting apparatuses 100 supplied with the cutting blade by the cutting blade supplying apparatus 2 are disposed along a Y direction indicated by arrow Y in FIG. 1. The cutting blade supplying apparatus 2 includes a cutting blade stocker 4 (see FIG. 1) that stocks a plurality of cutting blades, a carrying unit (carrying means) 6 (see FIG. 5) that carries out the cutting blade from the cutting blade stocker 4 and carries the cutting blade to the cutting apparatus 100, a transferring unit (transferring means) 8 (see FIG. 6) that transfers the cutting blade carried by the carrying unit 6 to a blade replacing unit (blade replacing means) 108, which will be described later, of the cutting apparatus 100, and a control unit (control means) (not depicted). Note that an X direction indicated by arrow X in FIG. 1 is a direction orthogonal to the Y direction, and a plane defined by the X direction and the Y direction is substantially horizontal. In addition, herein, the direction indicated by arrow of the X direction in FIG. 1 is taken as a forward direction (front side), and the opposite direction is taken as a rearward direction (rear side), in the following description.

Figure 2:
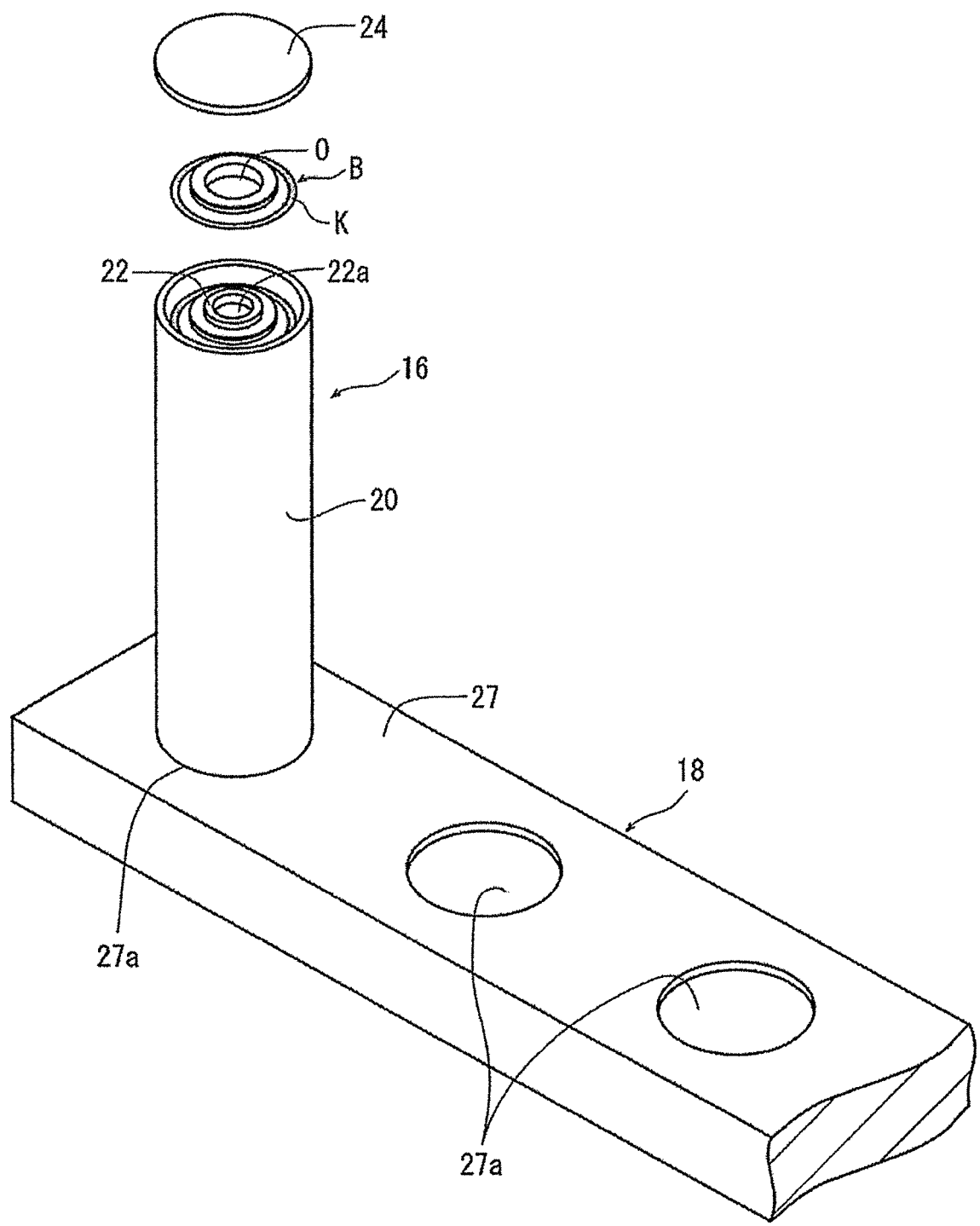
FIG. 2 is an inside perspective view of a cutting blade stocker depicted in FIG. 1.

The cutting blade stocker 4 will be described referring to FIGS. 1 to 4. As depicted in FIG. 1, the cutting blade stocker 4 includes a rectangular parallelepiped-shaped frame body 10 that can stock a plurality of cutting blades therein. On a front surface of the frame body 10, hinged double doors 12 fitted with handles 12a are mounted, the doors 12 are opened by a worker, and cutting blades are stocked in the inside of the frame body 10. On an upper surface of the frame body 10, there is mounted a display unit (display means) 14 for displaying the numbers of the cutting blades capable of being further stocked in the cutting blade stocker 4, and the numbers of the cutting blades stocked in the cutting blade stocker 4, on the basis of the kind of the cutting blade. As depicted in FIG. 2, a cutting blade case 16 for accommodating annular cutting blade B, each composed of a mounting port O formed in the center thereof to be mounted to a spindle (described later) 128 of the cutting apparatus 100 and a cutting edge K formed at an outer periphery of the mounting port O, and a cutting blade case mounting unit (cutting blade case mounting means) 18 on which to mount the cutting blade cases 16 are provided in the inside of the frame body 10. The cutting blade case 16 includes at least a cylindrical tubular body 20 that accommodates two or more cutting blades B in a stacked state, and a cylindrical rod 22 to be inserted in the mounting ports O of the cutting blades B to avoid contact between the peripheral edge of the cutting edge K and an inner wall of the tubular body 20. In the embodiment illustrated, as depicted in FIGS. 3A to 3D, the cutting blade case 16 includes a circular disk-shaped lid wall 24 that detachably closes one end portion (an upper end portion in FIGS. 3A to 3D) of the tubular body 20, and a circular disk-shaped end wall 26 that closes the other end portion (a lower end portion in FIGS. 3A to 3D) of the tubular body 20, and the rod 22 is fixed to a central portion of the end wall 26. As depicted in FIGS. 3A to 3D, the other end portion of the tubular body 20 and a peripheral edge portion of the end wall 26 may be fixed to each other, or, as depicted in FIGS. 4A to 4C, the other end portion of the tubular body 20 and the peripheral edge portion of the end wall 26 may be configured to be attachable and detachable. Note that in the modification of the cutting blade case 16 depicted in FIGS. 4A to 4C, the lid wall 24 is fixed to one end portion of the tubular body 20. In the embodiment illustrated, as depicted in FIGS. 3A to 3D, an end face in the axial direction of the rod 22 is formed with a to-be-engaged recess 22a, and one surface of the lid wall 24 is formed with an engaging projection 24a for engagement with the to-be-engaged recess 22a. With the engaging projection 24a engaged with the to-be-engaged recess 22a, the lid wall 24 is detachably mounted to the rod 22, and one end portion of the tubular body 20 is closed with the lid wall 24. The cutting blade case mounting unit 18 in the embodiment illustrated is composed of a mounting plate 27 extending in the Y direction. An upper surface of the mounting plate 27 is formed with three circular mounting recesses 27a recessed downward, at intervals in the Y direction. The diameter of the mounting recess 27a corresponds to the outside diameter of the tubular body 20 of the cutting blade case 16. The cutting blade cases 16 in which the cutting blades B are accommodated on the basis of the kind of the cutting blade B are mounted in the mounting recesses 27a. In addition, the rear side of the frame body 10 is open, so that the cutting blades B accommodated in each cutting blade case 16 can be carried out by the carrying unit 6 through the open rear side of the frame body 10.

Figure 5:
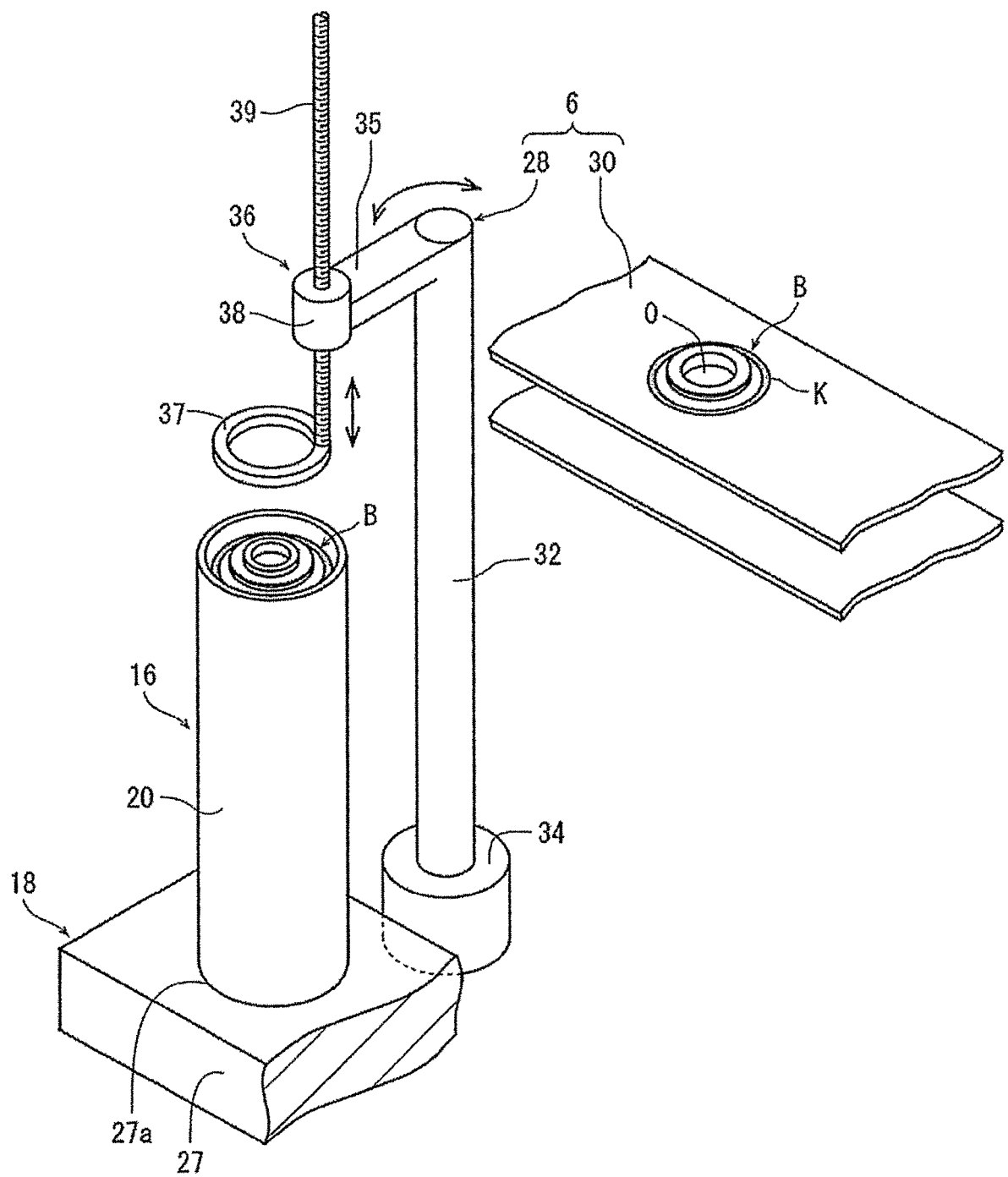
FIG. 5 is a perspective view of the cutting blade stocker and a carrying unit depicted in FIG. 2.

The carrying unit 6 will be described referring to FIGS. 1 and 5. In the embodiment illustrated, as depicted in FIG. 5, the carrying unit 6 includes at least a carrying-out section 28 that carries out the cutting blade B from the cutting blade stocker 4, and a belt conveyor 30 that carries the cutting blade B carried out by the carrying-out section 28 to the cutting apparatus 100. The carrying-out section 28 includes a support column 32 extending in the vertical direction adjacently to the cutting blade case 16, and a motor 34 fixed to a lower end of the support column 32. The support column 32 is rotated about an axis extending in the vertical direction by the motor 34. A base end portion of an arm 35 extending substantially horizontally is fixed to an upper end of the support column 32. An annular suction holding piece 37 is connected to a tip portion of the arm 35 in a vertically movable manner through a lift mechanism 36. The lift mechanism 36 includes a housing 38 fixed to the tip portion of the arm 35, a pinion gear (not depicted) provided in the inside of the housing 38, a motor (not depicted) for rotating the pinion gear, and a rack gear 39 meshed with the pinion gear. When the pinion gear is rotated by the motor, the rack gear 39 extending in the vertical direction is moved upward or downward, whereby the suction holding piece 37 connected to the lower end of the rack gear 39 is moved upward or downward. The suction holding piece 37 formed with a plurality of suction holes (not depicted) in a lower surface thereof is connected to suction means (not depicted) through a flow passage. In the carrying-out section 28, a suction force is generated at the lower surface of the suction holding piece 37 by the suction means, whereby the cutting blade B accommodated in the cutting blade case 16 can be suction held by the suction holding piece 37; in addition, by driving the lift mechanism 36 and the motor 34, the cutting blade B suction held by the suction holding piece 37 can be carried out from the cutting blade case 16 in the cutting blade stocker 4 and be carried to the belt conveyor 30. Note that the number of the carrying-out sections 28 may be equal to the number of the cutting blade cases 16 in the cutting blade stocker 4. Alternatively, in the case where the suction holding piece 37 can be located at each of the plurality of cutting blade cases 16 (for example, in the case where the arm 35 is configured to be contractible and expandable in a horizontal direction and the carrying-out section 28 is provided with contraction/expansion means for contracting and expanding the arm 35), the number of the carrying-out sections 28 may be smaller than the number of the cutting blade cases 16. As depicted in FIG. 1, the belt conveyor 30 extends in the Y direction, from the rear side of the carrying-out section 28 to the rear side of the cutting apparatus 100 spaced most apart from the cutting blade stocker 4. The belt conveyor 30 receives the cutting blade B carried out by the carrying-out section 28, and carries the cutting blade B selectively to the rear side of one of the three cutting apparatuses 100.

Figure 6:
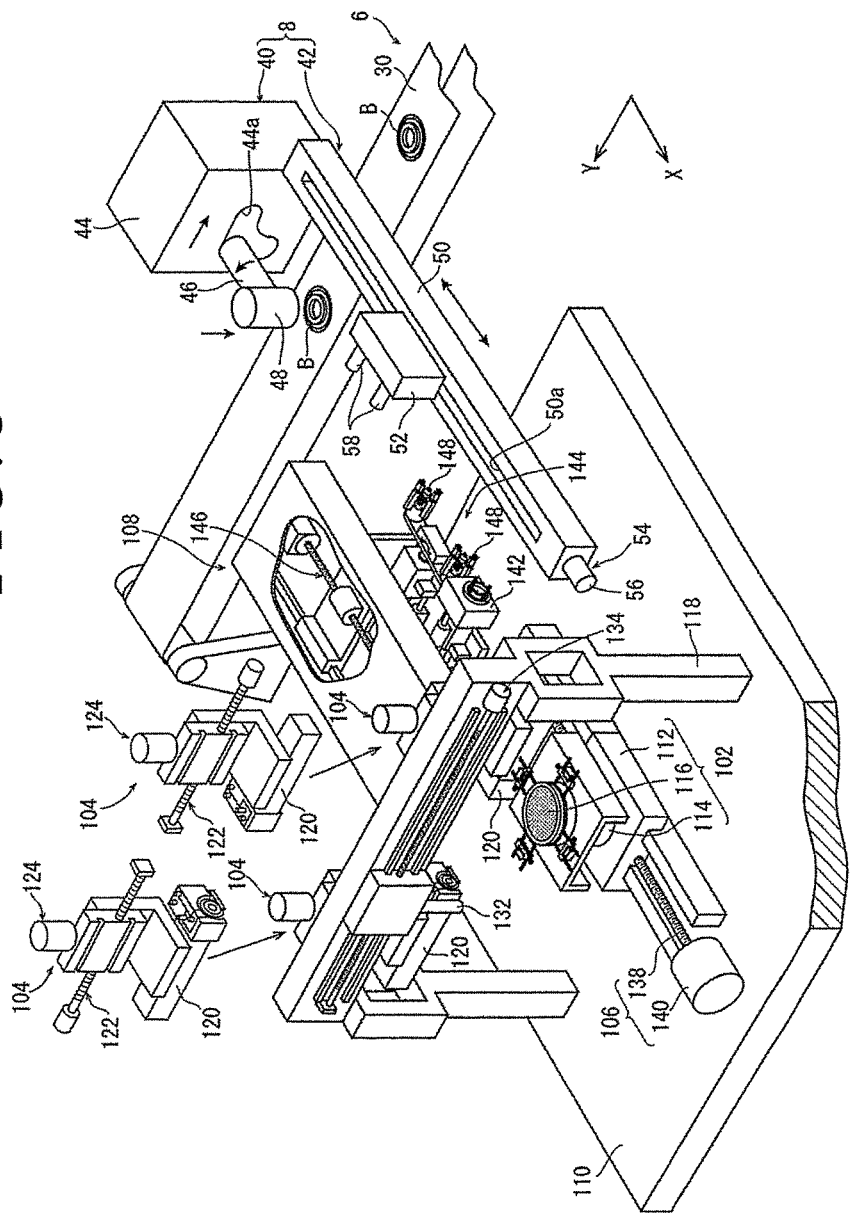
FIG. 6 is a perspective view depicting part of a transferring unit and the cutting apparatus.

The transferring unit 8 will be described referring to FIG. 6. The transferring unit 8 in the embodiment illustrated includes at least a carrying-out machine 40 that holds and carries out the cutting blade B carried by the carrying unit 6, and a blade rack 42 that receives the cutting blade B carried out by the carrying-out machine 40 and carries the cutting blade B to the blade replacing unit 108 of the cutting apparatus 100. The carrying-out machine 40 includes a casing 44 disposed on the rear side of the cutting apparatus 100, with the belt conveyor 30 of the carrying unit 6 interposed therebetween. An L-shaped opening 44a is formed in a front surface (a surface on the viewer's side of FIG. 6) of the casing 44, and an arm 46 protruding in the X direction through the L-shaped opening 44a is supported by the casing 44 in such a manner as to be rotatable about an axis extending in the X direction, to be movable in the Y direction and to be movable upward and downward. In addition, rotating means (not depicted) for rotating the arm 46 about an axis extending in the X direction, Y-direction moving means (not depicted) for moving the arm 46 in the Y direction along a part extending in the Y direction of the L-shaped opening 44a, and lifting means (not depicted) for lifting the arm 46 upward and downward along a part extending in the vertical direction of the L-shaped opening 44a are provided in the casing 44. The rotating means can be composed of a motor connected to the arm 46. The Y-direction moving means can be composed, for example, of a ball screw extending in the Y direction, with a nut section connected to the arm 46 through the rotating means, and a motor connected to the ball screw. The lifting means can be composed, for example, of a ball screw extending in the vertical direction, with a nut section connected to the arm 46 through the rotating means and the Y-direction moving means, and a motor connected to the ball screw. In addition, as depicted in FIG. 6, a cylindrical suction holding piece 48 is fixed to a tip portion of the arm 46. The suction holding piece 48 formed with a plurality of suction holes (not depicted) in one end surface (a lower surface in FIG. 6) in regard of the axial direction thereof is connected to suction means (not depicted) through a flow passage. In the carrying-out machine 40, a suction force is generated at the lower surface of the suction holding piece 48 by the suction means, whereby the cutting blade B carried by the belt conveyor 30 of the carrying unit 6 can be suction held by the suction holding piece 48, and, by moving and rotating the arm 46 by the lifting means, the Y-direction moving means, and the rotating means, the cutting blade B suction held by the suction holding piece 48 can be carried out from the belt conveyor 30.

The description of the transferring unit 8 will be continued referring to FIG. 6. The blade rack 42 of the transferring unit 8 includes a guide member 50 extending in the X direction from the upper side of the belt conveyor 30 to a position for facing the blade replacing unit 108 of the cutting apparatus 100, adjacently to the carrying-out machine 40, a rectangular parallelepiped-shaped movable piece 52 mounted on the guide member 50 such as to be movable in the X direction, and X-direction moving means 54 that moves the movable piece 52 in the X direction. An upper surface of the guide member 50 is formed with a guide opening 50a extending in the X direction. The X-direction moving means 54 includes a ball screw (not depicted) extending in the X direction in the inside of the guide member 50, and a motor 56 connected to the ball screw, and moves the movable piece 52 in the X direction along the guide opening 50a of the guide member 50. As depicted in FIG. 6, a pair of cylindrical support shafts 58 projecting in the Y direction are additionally provided at one end face in regard of the Y direction of the movable piece 52. The diameter of the support shaft 58 corresponds to the inside diameter of the cutting blade B, and the mounting port O of the cutting blade B is fitted to the support shaft 58 by the carrying-out machine 40, whereby the cutting blade B is supported by the support shaft 58 of the movable piece 52. Besides, in the blade rack 42, with the movable piece 52 moved in the X direction by the X-direction moving means 54, the cutting blade B supported by the support shaft 58 of the movable piece 52 can be carried to a position where it can be transferred to the blade replacing unit 108 of the cutting apparatus 100. In addition, a surface on the support shaft 58 side of the movable piece 52 is formed with a plurality of suction holes (not depicted) arranged in an annular pattern along the support shaft 58, and the suction holes in the movable piece 52 are connected to suction means (not depicted) through flow passages. A suction force is generated at the one end face in regard of the Y direction of the movable piece 52 by the suction means, whereby the cutting blade B supported by the support shaft 58 can be held by suction. As a result, the cutting blade B can be prevented from falling off the support shaft 58 during when the movable piece 52 is moved in the X direction. Note that only one transferring unit 8 is depicted in FIG. 6 for convenience, but, as will be described later, each of the cutting apparatuses 100 has a pair of cutting units (cutting means) 104 and a pair of blade replacing units 108, and a pair of transferring units 8 are provided on the rear side of each cutting unit 104 correspondingly to the numbers of the cutting units 104 and the blade replacing units 108. In other words, in the embodiment illustrated, the three cutting apparatuses 100 are provided, and, therefore, a total of six transferring units 8 are provided.

The control unit of the cutting blade supplying apparatus 2 that is composed of a computer includes a central processing unit (CPU) that performs arithmetic processing according to a control program, a read only memory (ROM) that stores the control program and the like, and a random access memory (RAM) capable of writing and reading that stores calculation results and the like. The control unit is electrically connected to the carrying unit 6, the transferring unit 8, and the display unit 14, and controls the carrying unit 6 and the transferring unit 8 in such a manner that the cutting blade B required by the cutting apparatus 100 is appropriately selected and is carried from the cutting blade stocker 4 to the rear side of the cutting apparatus 100 by the carrying unit 6, and that the cutting blade B is transferred from the carrying unit 6 to the blade replacing unit 108 of the cutting apparatus 100 by the transferring unit 8. Since the cutting blades B are accommodated in each of the cutting blade cases 16 on the basis of the kind of the cutting blade B, the control unit records the numbers of the carried-out cutting blades B on the basis of the cutting blade case 16, thereby recording the numbers of the cutting blades B carried out from the cutting blade stocker 4 on the basis of the kind of the cutting blade B, and causing the numbers of the cutting blades B capable of being further stocked in the cutting blade stocker 4 and the number of the cutting blades B stocked in the cutting blade stocker 4 to be calculated, and displayed on the display unit 14, on the basis of the kind of the cutting blade B. In addition, in the case where the number of the cutting blades B stocked in the cutting blade stocker 4 is reduced below a predetermined number, the situation may be displayed on the display unit 14, thereby urging the operator to supplement the cutting blades B.

Here, the cutting apparatus 100 supplied with the cutting blade B by the cutting blade supplying apparatus 2 will be described. The three cutting apparatuses 100 provided in the embodiment illustrated may be the same in configuration; specifically, as depicted in FIG. 6, the cutting apparatuses 100 each include at least a holding unit (holding means) 102 that holds a workpiece, the cutting unit 104 in which the cutting blade B for cutting the workpiece held by the holding unit 102 is mounted rotatably, a feeding unit (feeding means) 106 that puts the holding unit 102 and the cutting unit 104 into relative processing feeding, and the blade replacing unit 108 that automatically mounts and detaches the cutting blade B mounted in the cutting unit 104.

As depicted in FIG. 6, the holding unit 102 includes a movable plate 112 mounted on a base 110 of the cutting apparatus 100 such as to be movable in the X direction, a support column 114 fixed on an upper surface of the movable plate 112, and a chuck table 116 rotatably mounted on an upper end of the support column 114. The chuck table 116 configured to suction hold a workpiece such as a wafer on an upper surface thereof is rotated about an axis extending in the vertical direction by a motor (not depicted) incorporated in the support column 114.

Figure 7:
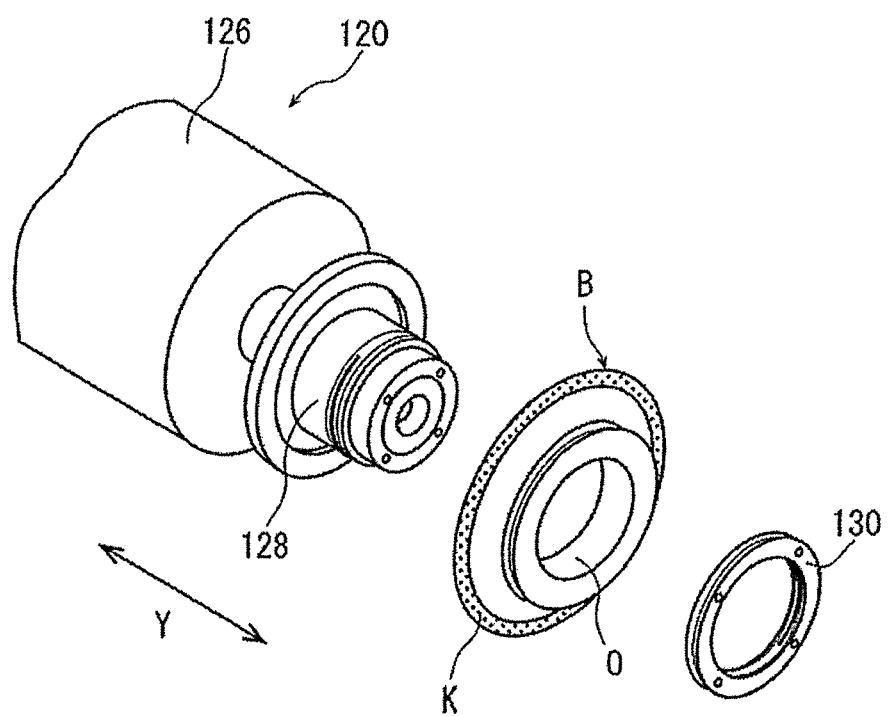
FIG. 7 is an exploded perspective view depicting part of a spindle unit depicted in FIG. 6.

The cutting unit 104 will be described referring to FIGS. 6 and 7. In the embodiment illustrated, as depicted in FIG. 6, the pair of cutting units 104 are mounted to a gate-type support frame 118 disposed straddling the holding unit 102. Each of the cutting units 104 includes a spindle unit 120 supported on the support frame 118 such as to be movable in the Y direction and liftable upward and downward, indexing feeding means 122 that moves the spindle unit 120 in the Y direction, and cutting-in feeding means 124 that lifts the spindle unit 120 upward and downward. As depicted in FIG. 7, the spindle unit 120 includes a cylindrical spindle 128 supported on a spindle housing 126 such as to be rotatable about an axis extending in the Y direction, a motor (not depicted) that rotates the spindle 128, the cutting blade B detachably fixed to a tip portion of the spindle 128, and a nut 130 for fixing the cutting blade B to the tip portion of the spindle 128. In addition, cutting blade monitoring means (not depicted) that monitors the degree of wear of the cutting edge K of the cutting blade B and the presence or absence of chipping of the cutting edge K is mounted to the cutting unit 104. As depicted in FIG. 6, imaging means 132 for imaging the workpiece held by the chuck table 116 and detecting a region to be cut is supported on the support frame 118 in such a manner as to be movable in the Y direction, and moving means 134 that moves the imaging means 132 in the Y direction is mounted to the support frame 118.

As depicted in FIG. 6, the feeding unit 106 includes a ball screw 138 extending in the X direction on the base 110, and a motor 140 connected to the ball screw 138. The ball screw 138 is connected to the movable plate 112 of the holding unit 102. The feeding unit 106 converts a rotational motion of the motor 140 into a rectilinear motion by the ball screw 138, and transmits the rectilinear motion to the movable plate 112, thereby effecting processing feeding of the holding unit 102 in the X direction relative to the cutting unit 104.

The blade replacing unit 108 includes: a nut attaching/detaching mechanism 142 for attaching and detaching the nut 130 to and from the spindle 128 of the cutting unit 104;

a blade mounting/detaching mechanism 144 for mounting and detaching the cutting blade B to and from the spindle 128; and position adjusting means 146 for adjusting X-direction positions and Y-direction positions of the nut attaching/detaching mechanism 142 and the blade mounting/detaching mechanism 144. The nut attaching/detaching mechanism 142 is configured such that the nut 130 fixed to the spindle 128 can be loosened and detached from the spindle 128, and the nut 130 detached from the spindle 128 can be grasped. The blade mounting/detaching mechanism 144 has a pair of blade grasping means 148 disposed with an interval therebetween. The blade mounting/detaching mechanism 144 is configured such that the cutting blade B is grasped and drawn out from the spindle 128, from which the nut 130 has been detached, by one of the pair of blade grasping means 148, and the cutting blade B for replacement which is to be mounted to the spindle 128 is grasped and mounted to the spindle 128 by the other of the pair of blade grasping means 148. The nut attaching/detaching mechanisms 142 and the blade mounting/detaching mechanisms 144 are disposed in pairs and in line symmetry at an interval in the Y direction, correspondingly to the pair of cutting units 104. Note that the specific configuration of the blade replacing unit 108 may be substantially the same as the configuration disclosed in Japanese Patent No. 4837973.

The cutting apparatus 100 further includes a controller (not depicted) for controlling its own operation and for determining whether or not replacement of the cutting blade B is required, based on information outputted from the cutting blade monitoring means. The controller composed of a computer is electrically connected to the holding unit 102, the cutting unit 104, the feeding unit 106, the blade replacing unit 108 and the cutting blade monitoring means as well as to the control unit of the cutting blade supplying apparatus 2. In addition, as depicted in FIG. 1, the cutting apparatus 100 is provided with cleaning means 150 for cleaning the workpiece after cutting, a cassette 152 for accommodating the workpieces, a carrying mechanism 154 for carrying the workpiece between the cleaning means 150 and the cassette 152 and the chuck table 116, and input means 156 for inputting processing conditions and the like to the controller.

An operation of the cutting blade supplying apparatus 2 as aforementioned will be described. When replacement of the cutting blade B mounted to the cutting apparatus 100 is required due to wearing or chipping, information on the kind of the cutting blade B to be replaced, information on to which one of the pair of cutting units 104 the cutting blade B to be replaced is mounted, and an instruction to supply the cutting blade B are outputted to the control unit of the cutting blade supplying apparatus 2 from the controller of the cutting apparatus 100 in which the replacement of the cutting blade B is required. Then, based on the information outputted from the controller of the cutting apparatus 100, the control unit of the cutting blade supplying apparatus 2 selects the cutting blade case 16 of the cutting blade stocker 4 in which the cutting blade B to be supplied to the cutting apparatus 100 is stocked. Note that the controller of the cutting apparatus 100 performs such a control that the nut 130 is detached from the spindle 128 by the nut attaching/detaching mechanism 142 of the blade replacing unit 108 and that the cutting blade B is detached from the spindle 128 by one of the blade grasping means 148 of the blade mounting/detaching mechanism 144.

Next, the control unit performs such a control that the cutting blade B for replacement which is to be newly mounted to the cutting unit 104 (hereinafter referred to as the "replacing cutting blade B") is carried out from the cutting blade case 16 stocking the replacing cutting blades B therein by the carrying-out section 28 of the carrying unit 6, and is mounted on the belt conveyor 30. Describing in detail while referring to FIG. 5, first, the support column 32 is rotated by the motor 34 of the carrying-out section 28, and the suction holding piece 37 is positioned on the upper side of the cutting blade case 16 in which the replacing cutting blades B are stocked. Next, the suction holding piece 37 is lowered by the lift mechanism 36, and a lower surface of the suction holding piece 37 is brought into close contact with an upper surface of the replacing cutting blade B. Subsequently, the suction means connected to the suction holding piece 37 is operated to generate a suction force at the lower surface of the suction holding piece 37, whereby the lower surface of the suction holding piece 37 is held in close contact with the upper surface of the replacing cutting blade B by suction. Next, the suction holding piece 37 is moved upward by the lift mechanism 36. Subsequently, the support column 32 is rotated by the motor 34, and the replacing cutting blade B suction held by the suction holding piece 37 is positioned on the upper side of the belt conveyor 30. Next, the suction holding piece 37 is lowered by the lift mechanism 36, to bring the lower surface of the replacing cutting blade B into contact with the upper surface of the belt conveyor 30. Then, the operation of the suction means connected to the suction holding piece 37 is stopped to release the suction force of the suction holding piece 37, and the replacing cutting blade B is placed on the upper surface of the belt conveyor 30. In this way, the control unit causes the replacing cutting blade B to be carried out from the cutting blade case 16 by the carrying-out section 28, and to be placed on the belt conveyor 30.

Next, the control unit causes the belt conveyor 30 to carry the replacing cutting blade B to a position where the replacing cutting blade B can be transferred to the transferring unit 8 disposed on the rear side of the cutting unit 104 in which replacement of the cutting blade B is required.

Subsequently, the control unit performs such a control that the replacing cutting blade B carried by the belt conveyor 30 is carried out by the carrying-out machine 40 of the transferring unit 8, and is transferred to the blade rack 42. More in detail, first, the arm 46 is lowered by the lifting means of the carrying-out machine 40, and the lower surface of the suction holding piece 48 is brought into close contact with the upper surface of the replacing cutting blade B. Next, the suction means connected to the suction holding piece 48 is operated to generate a suction force at the lower surface of the suction holding piece 48, whereby the lower surface of the suction holding piece 48 is held in close contact with the upper surface of the replacing cutting blade B by suction. Subsequently, the arm 46 is moved upward by the lifting means, and the arm 46 is rotated by the rotating means, whereby the replacing cutting blade B suction held by the suction holding piece 48 is made to face the movable piece 52 of the blade rack 42. In this instance, the position of the movable piece 52 is adjusted by the X-direction moving means 54 in such a manner that one of the support shafts 58 of the movable piece 52 and the mounting port O of the replacing cutting blade B are aligned as viewed in the Y direction. Next, the arm 46 is moved in the Y direction by the Y-direction moving means, and the replacing cutting blade B is fitted to the one of the support shafts 58 of the movable piece 52. Subsequently, the operation of the suction means connected to the suction holding piece 48 of the carrying-out machine 40 is stopped to release the suction force of the suction holding piece 48 of the carrying-out machine 40, whereas the suction means connected to the movable piece 52 of the blade rack 42 is operated to generate a suction force at an end face on the support shaft 58 side of the movable piece 52, whereby the replacing cutting blade B is suction held onto the end face on the support shaft 58 side of the movable piece 52. As a result, the replacing cutting blade B carried by the belt conveyor 30 is carried out by the carrying-out machine 40 of the transferring unit 8, and is transferred to the blade rack 42.

Next, the control unit causes the X-direction moving means 54 of the blade rack 42 to move the movable piece 52 to a position where the replacing cutting blade B held by the movable piece 52 faces the blade replacing unit 108 of the cutting apparatus 100. Subsequently, the control unit stops the operation of the suction means connected to the movable piece 52 to release the suction force of the movable piece 52. Next, the replacing cutting blade B is carried out from one of the support shafts 58 of the movable piece 52 by the other blade grasping means 148 (the blade grasping means 148 which does not grasp the cutting blade B detached from the cutting unit 104) of the blade mounting/detaching mechanism 144, and the cutting blade B having been mounted to the cutting unit 104 is transferred from the one blade grasping means 148 to the other support shaft 58 of the movable piece 52. Then, the replacing cutting blade B is mounted to the cutting unit 104 by the blade replacing unit 108. On the other hand, the cutting blade B detached from the cutting unit 104 is transferred to the cutting blade stocker 4 through a reverse route to that of the replacing cutting blade B. Specifically, the detached cutting blade B is carried by the blade rack 42, is then placed on the belt conveyor 30 of the carrying unit 6 by the carrying-out machine 40, is carried by the belt conveyor 30, and is thereafter carried into the inside of the frame body 10 of the cutting blade stocker 4 by the carrying-out section 28 of the carrying unit 6. Then, the cutting blades B carried into the frame body 10 are stocked for a predetermined period in the state of being divided on the basis of each cutting unit 104, and is referred to at the time of investigating the cause of a trouble when, for example, a trouble has occurred in the cutting apparatus 100.

As has been described above, in the cutting blade supplying apparatus 2, a sufficient number of cutting blades B for replacement can be stocked in the cutting blade stocker 4, the cutting apparatus 100 provided with the blade replacing unit 108 can be appropriately supplied with the cutting blade B by the carrying unit 6 and the transferring unit 8, and, therefore, an unmanned operation of the cutting apparatus 100 for a long time can be realized.

In addition, since the cutting blade case 16 can be used as part of the cutting blade stocker 4, it is unnecessary, at the time of supplementing the cutting blade stocker 4 with the cutting blades B, to supplement the cutting blades B one by one, and it is sufficient to mount the cutting blade case 16 accommodating a plurality of cutting blades B on the cutting blade case mounting unit 18, which permits easy supplement of the cutting blade supplying apparatus 2 with the cutting blades B.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A cutting blade supplying apparatus for supplying a cutting blade to a cutting apparatus, the cutting apparatus including a holding unit configured to hold a workpiece, a cutting unit to which a cutting blade for cutting the workpiece held by the holding unit is rotatably mounted, a feeding unit configured to put the holding unit and the cutting unit into relative processing feeding, and a blade replacing unit configured to automatically mount and detach the cutting blade mounted to the cutting unit, the cutting blade supplying apparatus comprising:
   a cutting blade stocker that stocks a plurality of cutting blades;
   a carrying unit that carries out the cutting blade from the cutting blade stocker and carries the cutting blade to the cutting apparatus;
   a transferring unit that transfers the cutting blade carried by the carrying unit to the blade replacing unit; and
   a control unit,
   wherein the cutting blade stocker includes a cutting blade case that accommodates the cutting blade, wherein the cutting blade includes a mounting port formed in a center thereof to be mounted to a spindle and a cutting edge formed at an outer periphery of the mounting port, and a cutting blade case mounting unit on which to mount the cutting blade case,
   the cutting blade case includes a tubular body that accommodates two or more cutting blades in a stacked state, and a rod to be inserted in the mounting port to avoid contact between the cutting edge and an inner wall of the tubular body, and
   the control unit selects the cutting blade required by the cutting apparatus and causes the cutting blade to be carried by the carrying unit to the cutting apparatus.

2. The cutting blade supplying apparatus according to claim 1, wherein the carrying unit includes a carrying-out section that carries out the cutting blade from the cutting blade stocker, and a belt conveyor that carries the cutting blade carried out by the carrying-out section to the cutting apparatus.

3. The cutting blade supplying apparatus according to claim 1, wherein the transferring unit includes a carrying-out machine that holds and carries out the cutting blade carried by the carrying unit, and a blade rack that receives the cutting blade carried out by the carrying-out machine and carries the cutting blade to the blade replacing unit.

4. The cutting blade supplying apparatus according to claim 1, further comprising:
   a display unit,
   wherein the control unit records the numbers of the cutting blades carried out from the cutting blade stocker on the basis of the kind of the cutting blade, and causes the numbers of the cutting blades capable of being further stocked in the cutting blade stocker to be displayed on the display unit on the basis of the kind of the cutting blade.

5. The cutting blade supplying apparatus according to claim 1,
   wherein the cutting blade case includes a lid wall that detachably closes one end portion of the tubular body, and an end wall that closes the other end portion of the tubular body, and
   the rod is fixed to a central portion of the end wall.

* * * * *